(12) United States Patent
Chun

(10) Patent No.: US 8,748,984 B2
(45) Date of Patent: Jun. 10, 2014

(54) SEMICONDUCTOR DEVICE AND METHOD FOR FABRICATING THE SAME

(71) Applicant: SK Hynix Inc., Icheon (KR)

(72) Inventor: Sung Kil Chun, Seoul (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 13/858,844

(22) Filed: Apr. 8, 2013

(65) Prior Publication Data

US 2013/0285128 A1    Oct. 31, 2013

Related U.S. Application Data

(62) Division of application No. 13/346,947, filed on Jan. 10, 2012, now Pat. No. 8,435,847.

(30) Foreign Application Priority Data

Apr. 29, 2011    (KR) .................... 10-2011-0041130

(51) Int. Cl.
*H01L 27/01*    (2006.01)

(52) U.S. Cl.
USPC ..................... 257/347; 257/353; 257/401

(58) Field of Classification Search
USPC .................... 257/347, 353, 354, 364, 401
See application file for complete search history.

(56) References Cited

U.S. PATENT DOCUMENTS

| | | | |
|---|---|---|---|
| 6,873,009 B2 * | 3/2005 | Hisamoto et al. ............ | 257/329 |
| 7,224,033 B2 * | 5/2007 | Zhu et al. ..................... | 257/401 |
| 7,394,116 B2 * | 7/2008 | Kim et al. ..................... | 257/213 |
| 7,625,776 B2 * | 12/2009 | Wells et al. ................... | 438/68 |
| 2007/0114612 A1 * | 5/2007 | Ahn et al. ..................... | 257/364 |
| 2010/0048027 A1 * | 2/2010 | Cheng et al. ................. | 438/745 |

* cited by examiner

*Primary Examiner* — Kevin M Picardat

(57) ABSTRACT

A semiconductor device and a method for fabricating the same are disclosed. A fin of the semiconductor device including a fin-shaped channel region is configured in the form of a non-uniform structure, and a leakage current caused by the electric field effect generated in the semiconductor device is prevented from being generated, resulting in an increased operation stability of the semiconductor device.

4 Claims, 15 Drawing Sheets

<X>

<Y>

SEMICONDUCTOR DEVICE AND METHOD FOR FABRICATING THE SAME

CROSS-REFERENCE TO RELATED APPLICATION

The present application is a divisional application of U.S. patent application Ser. No. 13/346,947 filed on Jan. 10, 2012, which claims priority of Korean Patent Application No. 10-2011-0041130 filed on 29 Apr. 2011, the disclosures of which are hereby incorporated in their entirety by reference.

BACKGROUND OF THE INVENTION

Embodiments of the present invention relate to a semiconductor device and a method for fabricating the same, in which a fin of the semiconductor device including a fin-shaped channel region is configured to have a multi-peak structure, and a leakage current caused by the electric field effect generated in the semiconductor device is prevented from being generated, resulting in an increased operation stability of the semiconductor device.

Generally, a semiconductor is a material that falls in an intermediate region between a conductor and a nonconductor material. Although a semiconductor is similar to a nonconductor in a pure state, electric conductivity of the semiconductor device is increased by doping or other manipulation. The semiconductor is used to form a semiconductor device such as a transistor through doping and multi-layered interconnections. A device that can perform various functions simultaneously while being formed of a semiconductor material is referred to as a semiconductor device. An example of the semiconductor device is a semiconductor memory device.

A semiconductor memory device for use in a system comprised of several semiconductor devices has been used to store data therein. If a data processing device, e.g., a Central Processing Unit (CPU), transmits a data request, a semiconductor memory device outputs stored data corresponding to an address input from the data processing device, or stores data output from the data processing device at a specific location corresponding to the address.

As the storage capacity of the semiconductor memory device is increased, the size of the memory unit cells is gradually decreased, and the sizes of several constituent elements for the read/write operations are also reduced. Therefore, assuming that there are no unnecessary overlapped wirings or transistors in the semiconductor memory device, minimizing the areas occupied by individual elements is of importance. In addition, reducing the size of several unit cells contained in the semiconductor memory device is importance to increasing the degree of integration.

A semiconductor memory device includes a plurality of unit cells each having a capacitor and a transistor. The capacitor is used to temporarily store data, and the transistor is used to transfer data between a bit line and the capacitor in response to a control signal (word line). The data transfer occurs by using a semiconductor property where electrical conductivity is changed depending on its environment. The transistor has three regions, i.e., a gate, a source, and a drain. Electric charges are moved between the source and the drain according to a control signal inputted to the gate of the transistor. The movement of the electric charges between the source and the drain is achieved through a channel region.

In the case where a conventional transistor is formed on a semiconductor substrate, a method of forming a gate on the semiconductor substrate and doping impurities into both sides of the gate so as to form a source and a drain has been used. As the data storage capacity of a semiconductor memory device has increased and the feature width thereof has decreased, the size of each unit cell must be gradually decreased. That is, the design rule of the capacitor and the transistor included in the unit cell has been reduced. Thus, while the channel length of a cell transistor is gradually decreased, the short channel effect, Drain Induced Barrier Lower (DIBL), etc. can occur in the conventional transistor and thus operational reliability is decreased. However, if a threshold voltage is maintained, it is possible to solve the problems generated due to decreased channel length. In general, as the channel of the transistor shortens, the concentration of the impurities doped into a region in which the channel is formed is increased.

However, if the concentration of the impurities doped into the channel region is increased while the design rule is reduced to 100 nm or less, the electric field of a Storage Node (SN) junction is increased, thereby lowering the refresh characteristics of a semiconductor memory device. In order to solve this problem, a cell transistor having a three-dimensional channel structure in which a channel extends in a vertical direction is used such that the channel length of the cell transistor is maintained even when the design rule is decreased.

An example cell transistor including a three-dimensional (3D) channel structure is a fin transistor in which a silicon section including a channel region is erected in the form of a thin fin and a gate is formed at both sides of the fin. Even when a channel width of a horizontal direction is short, since the channel length of the vertical direction is secured, impurity doping concentration may be reduced and thus refresh characteristics are prevented from being lowered. In the case of the above-mentioned fin structure, a drive current required for operating the transistor can be greatly increased as compared to a current planar gate structure in which a gate is located at a silicon planar surface, and a leakage current generated when the transistor is not operated can be prevented from being generated, such that the semiconductor device can be greatly reduced in size.

FIG. 1 is a plan view illustrating a conventional semiconductor device.

Referring to FIG. 1, the semiconductor device is formed in an active region 102 defined by a device isolation film 104 on a semiconductor substrate (not shown), and a gate pattern 106 is formed to cross the active region 102. The semiconductor device will hereinafter be described with reference to a horizontal cross-sectional view <X> and a vertical cross-sectional view <Y>.

FIGS. 2A and 2B are cross-sectional views illustrating a method for forming a conventional semiconductor device.

Referring to FIG. 2A, after a device isolation film 104 is formed over the semiconductor substrate 100 and a hard mask layer 110 is formed over the active region 102, the hard mask layer 110 is patterned using a mask that defines a specific location at which a gate pattern 106 is to be formed. Thereafter, the device isolation film 104 and the active region 102 are etched to a predetermined depth using the patterned hard mask layer 110 as an etch mask, such that a recess 112 is formed.

Referring to the horizontal cross-sectional view <X>, the device isolation film 104 is etched more than the active region 102 due to a difference in etch selection ratio (or etch selectivity) between the device isolation film 104 and the active region 102. Referring to the vertical cross-sectional view <Y>, the active region 102 being more protruded than the device isolation film 104 is configured in the form of a fin.

Referring to FIG. 2B, a gate oxide film 108 is formed over the active region 102 exposed by the recess 112. Thereafter, a conductive material is deposited over the recess 112 so as to form the gate pattern 106. In this case, the conductive material is formed of polysilicon. After formation of the gate pattern 106, the hard mask layer 110 is removed, and ion implantation is performed in the exposed active region 102, such that a source/drain region 114 is formed.

Referring to FIG. 3, a gate oxide film 108 is formed over the active region 102 exposed by the recess 112. Thereafter, a conductive material is deposited over the recess 112 so that the gate pattern 106 is formed. In this case, the conductive material may be a titanium nitride (TiN) material or may be formed to have a laminated structure of a TiN film and a tungsten (W) film. After that, the gate pattern 106 is etched back to form a buried gate pattern structure, the hard mask layer 110 is removed, and ion implantation is performed on the exposed active region 102, such that a source/drain region 114 is formed.

As the design rules are gradually reduced, spacing between the gate patterns 106 of a conventional semiconductor device including the fin-type channel region is also gradually reduced, and the distance from the gate pattern 106 formed by etching of the device isolation film 104 to the source/drain region 114 becomes shorter, resulting in the increase of a parasitic field effect. In more detail, since an off-leakage current (which is generated by leakage of data stored in a storage node is increased under the condition that a cell transistor of a unit cell is not activated because of the neighboring gate effect) is increased, dynamic refresh characteristics of the semiconductor device designed to operate the unit cell as well as to investigate the refresh operation are deteriorated. In addition, according to the conventional semiconductor device, a Gate Induced Drain Leakage (GIDL) is increased due to the passing gate effect, such that there are deteriorated static refresh characteristics in which data stored in a unit cell is read after a predetermined time to determine whether or not the data is normally stored.

BRIEF SUMMARY OF THE INVENTION

Various embodiments of the present invention are directed to providing a semiconductor device and a method for fabricating the same that substantially obviate one or more problems due to limitations and disadvantages of the related art.

An embodiment of the present invention relates to a semiconductor device and a method for fabricating the same, in which a fin of the semiconductor device including a fin-shaped channel region is configured in the form of a dual-peak structure, and a leakage current caused by the electric field effect generated in the semiconductor device is prevented from being generated, resulting in an increased operation stability of the semiconductor device.

In accordance with an aspect of the present invention, a unit cell includes a device isolation film defining an active region over a semiconductor substrate; an ion implantation region contained in the active region; and a fin-shaped active region contacting the ion implantation region, wherein the center part of the top surface of the fin-shaped active region is lower in height than the outer edge part of the top surface of the fin-shaped active region.

The fin-shaped active region may include a saddle-fin structure.

A difference in height between the center part of the top surface of the fin-shaped active region and the outer edge part of the top surface of the fin-shaped active region is 20% or higher of the width of the fin-shaped active region.

The semiconductor device may further include a gate insulation film and a gate pattern that are formed over the fin-shaped active region.

The semiconductor device may further include a source/drain region formed by implanting ions in the active region exposed between the gate patterns.

The gate pattern may include polysilicon.

In accordance with another aspect of the present invention, a semiconductor device includes a plurality of cell array including a plurality of unit cells; a row decoder coupled to the cell array, a column decoder coupled to the cell array; and a sense amplifier for sensing data stored in a unit cell selected by the row decoder and the column decoder. The unit cell includes a device isolation film for defining an active region over the semiconductor substrate; an ion implantation region contained in the active region; and a fin-shaped active region contacting the ion implantation region. In this case, the center part of the top surface of the fin-shaped active region is lower in height than the outer edge part of the top surface of the fin-shaped active region.

In accordance with another aspect of the present invention, a semiconductor module includes a plurality of semiconductor chips each including a plurality of unit cells; a command link coupled to the semiconductor chips so as to transmit/receive a command signal to and from the semiconductor chips; and a data link coupled to the semiconductor chips so as to transmit/receive data to and from the semiconductor chips. The unit cell includes a device isolation film for defining an active region over the semiconductor substrate; an ion implantation region contained in the active region; and a fin-shaped active region contacting the ion implantation region. In this case, the center part of the top surface of the fin-shaped active region is lower in height than the outer edge part of the top surface of the fin-shaped active region.

In accordance with another aspect of the present invention, a semiconductor system includes a plurality of semiconductor modules each including a plurality of unit cells; a command link coupled to the semiconductor modules so as to transmit/receive a command signal to and from the semiconductor modules; a data link coupled to the semiconductor modules so as to transmit/receive data to and from the semiconductor modules; and a controller for controlling an interactive interface with an external system. The unit cell includes a device isolation film for defining an active region over the semiconductor substrate; an ion implantation region contained in the active region; and a fin-shaped active region contacting the ion implantation region. In this case, the center part of the top surface of the fin-shaped active region is lower in height than the outer edge part of the top surface of the fin-shaped active region.

In accordance with another aspect of the present invention, an electronic unit includes a plurality of semiconductor systems each including a unit cell, and a processor coupled to the semiconductor systems. The unit cell includes a device isolation film for defining an active region over the semiconductor substrate; an ion implantation region contained in the active region; and a fin-shaped active region contacting the ion implantation region. In this case, the center part of the top surface of the fin-shaped active region is lower in height than the outer edge part of the top surface of the fin-shaped active region.

In accordance with another aspect of the present invention, an electronic system includes an electronic unit including a plurality of unit cells, and one or more interfaces coupled to the electronic unit. The unit cell includes a device isolation film for defining an active region over the semiconductor substrate; an ion implantation region contained in the active region; and a fin-shaped active region contacting the ion implantation region. In this case, the center part of the top surface of the fin-shaped active region is lower in height than the outer edge part of the top surface of the fin-shaped active region.

In accordance with another aspect of the present invention, a method for fabricating a semiconductor device includes: forming a device isolation film defining an active region over a semiconductor substrate; forming an ion implantation region in the active region; and forming a fin-shaped active region by etching the active region until the ion implantation region is exposed. In this case, the center part of the top surface of the fin-shaped active region is lower in height than the outer edge part of the top surface of the fin-shaped active region.

The fin-shaped active region may include a saddle-fin structure.

A difference in height between the center part of the top surface of the fin-shaped active region and the outer edge part of the top surface of the fin-shaped active region is 20% or higher of the width of the fin-shaped active region.

When etching the active region and the device isolation film, the device isolation film may be more etched than the active region.

The method for fabricating the semiconductor device may further include, after formation of the fin-shaped active region, forming a gate insulation film and a gate pattern over the fin-shaped active region.

The method for fabricating the semiconductor may further include forming a source/drain region by implanting ions in the active region exposed between the gate patterns.

The gate pattern may include polysilicon.

In accordance with another aspect of the present invention, a method for fabricating a semiconductor device includes forming a device isolation film defining an active region over a semiconductor substrate; forming an ion implantation region in the active region; forming a fin-shaped active region by etching the active region and the device isolation film until the ion implantation region is exposed; forming a gate insulation film and a gate pattern in the fin-shaped active region; and forming a buried gate pattern by etching back the gate pattern and the gate insulation film. In this case, the center part of the top surface of the fin-shaped active region is lower in height than the outer edge part of the top surface of the fin-shaped active region.

The fin-shaped active region may include a saddle-fin structure.

A difference in height between the center part of the top surface of the fin-shaped active region and the outer edge part of the top surface of the fin-shaped active region is 20% or higher of the width of the fin-shaped active region.

When etching the active region and the device isolation film, the device isolation film may be more etched than the active region.

The gate pattern may include a metal material. The metal material may be formed of either titanium nitride (TiN) or a laminated structure of titanium nitride (TiN) and tungsten (W).

In accordance with another aspect of the present invention, a method for fabricating a semiconductor device includes forming a device isolation film defining an active region over a semiconductor substrate; forming a hard mask pattern over the active region and the device isolation film; forming a first recess by etching the active region and the device isolation film using the hard mask pattern as an etch mask; and forming a fin-shaped active region by etching the active region exposed at a lower part of the first recess. In this case, the center part of the top surface of the fin-shaped active region is lower in height than the outer edge part of the top surface of the fin-shaped active region.

The fin-shaped active region may include a saddle-fin structure.

A difference in height between the center part of the top surface of the fin-shaped active region and the outer edge part of the top surface of the fin-shaped active region is 20% or higher of the width of the fin-shaped active region.

The forming of the first recess may use an anisotropic etching method.

The forming of the fin-shaped active region by etching the active region may use an isotropic etching method.

When etching the active region and the device isolation film, the device isolation film may be more etched than the active region.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

A semiconductor device according to an embodiment of the present invention is formed to include a saddle-fin gate, so that it can greatly improve dynamic refresh characteristics. In more detail, in the above-mentioned semiconductor device including the saddle-fin gate, a saddle-fin-type active region is configured to have a plurality of peaks (e.g., dual peaks), so that the surface distance of a fin that defines the channel length of a gate is increased, off-leakage characteristics of the saddle-fin gate is improved, and the neighbor gate effect is reduced, resulting in improved dynamic refresh characteristics.

Figure 1:
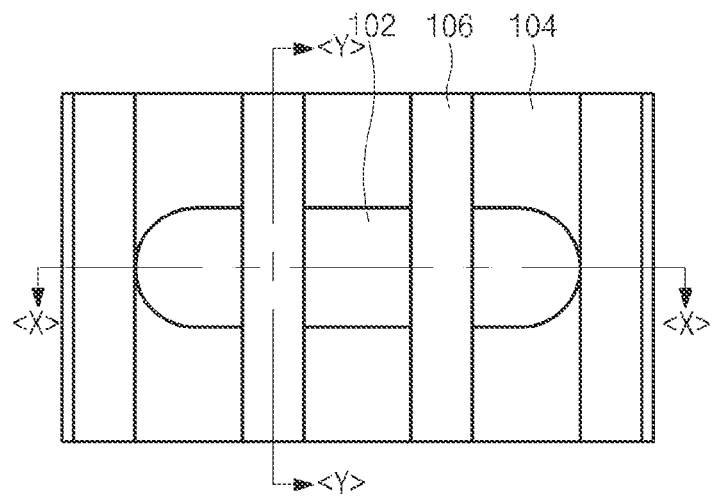
FIG. 1 is a plan view illustrating a conventional semiconductor device.
Figure 2A:
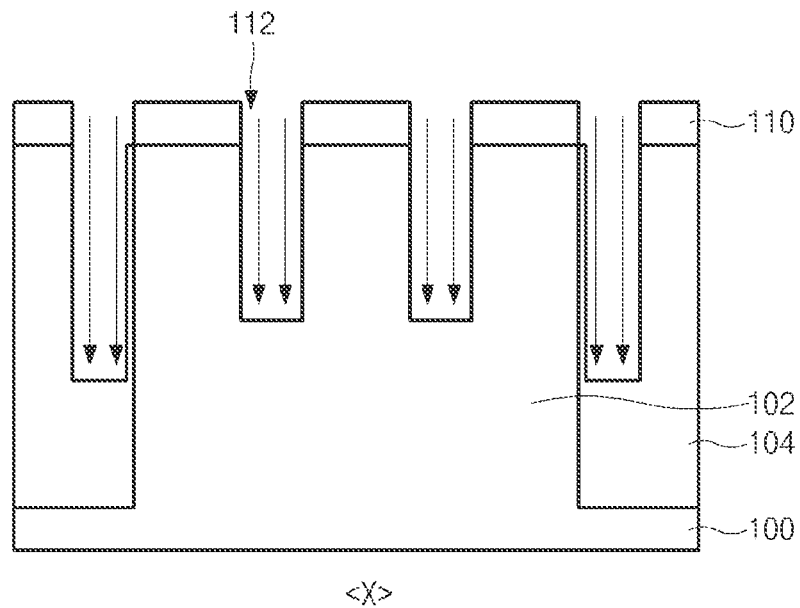
FIGS. 2A, 2B and 3 are cross-sectional views illustrating a method for fabricating the conventional semiconductor device.
Figure 2A:
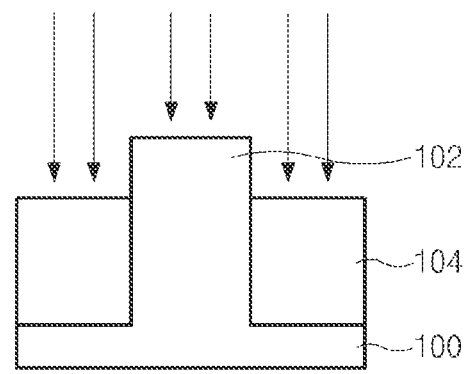
Figure 2B:
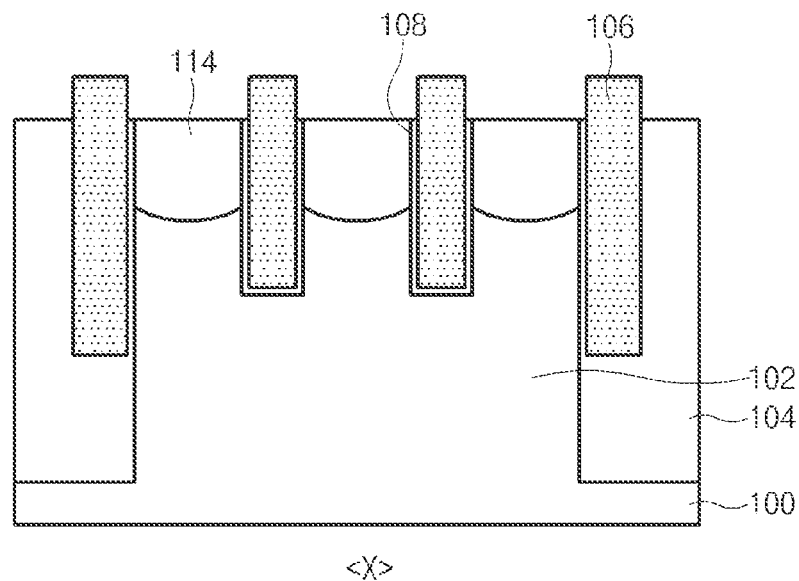
Figure 2B:
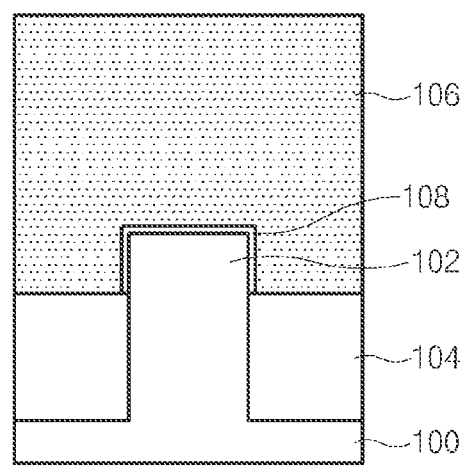
Figure 3:
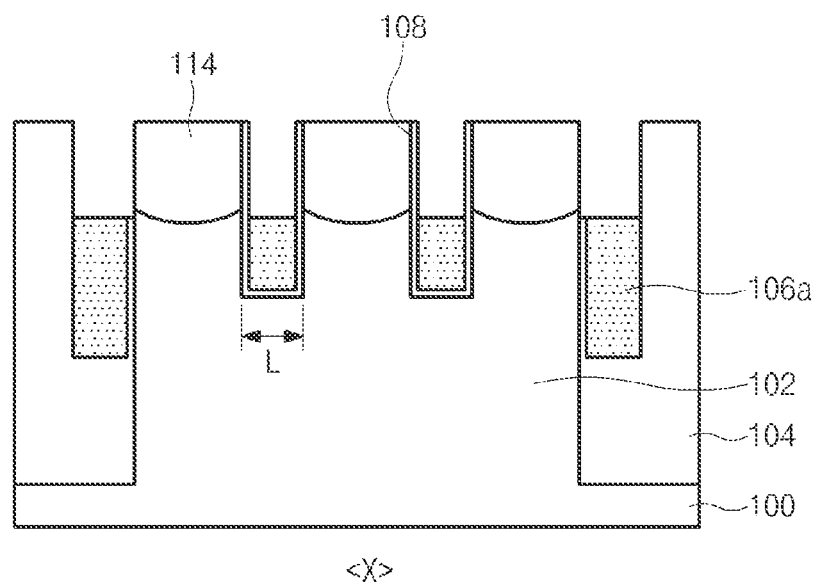
Figure 3:
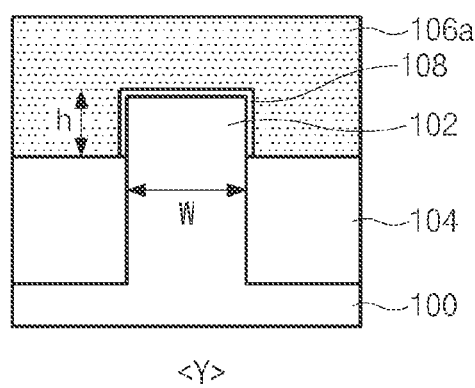
Figure 4:
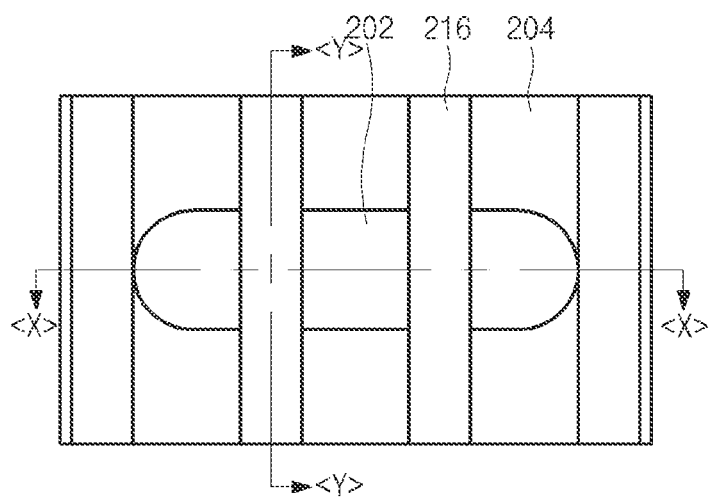
FIG. 4 is a plan view illustrating a method for fabricating a semiconductor device according to an embodiment of the present invention.

FIG. 4 is a plan view illustrating a method for fabricating a semiconductor device according to an embodiment of the present invention.

Referring to FIG. 4, the semiconductor device is formed over an active region 202 defined by a device isolation film 204 on a semiconductor substrate (not shown), gate patterns 216 are formed to cross the active region 202. The semiconductor device will hereinafter be described with reference to the horizontal cross-sectional view <X> and the vertical cross-sectional view <Y>.

FIGS. 5A to 5D are cross-sectional views illustrating a method for fabricating a semiconductor device according to one embodiment of the present invention.

Figure 5A:
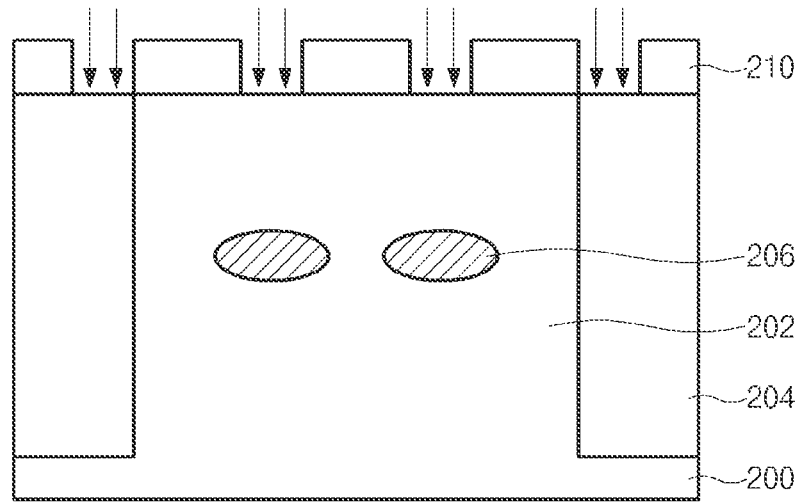
FIGS. 5A to 5D are cross-sectional views illustrating a method for fabricating a semiconductor device according to one embodiment of the present invention.
Figure 5A:
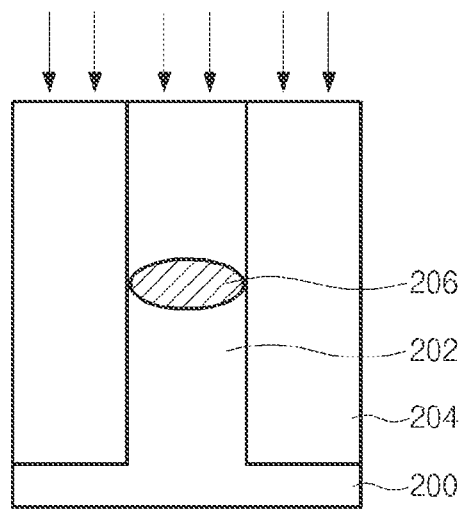

Referring to FIG. 5A, after a hard mask layer 210 is formed over a device isolation film 204 and an active region 202 of the semiconductor substrate 200, the hard mask layer 210 is patterned using a mask defining a specific position at which a gate pattern 216 is to be formed. In this case, the device isolation film 204 may be formed of an oxide film [for example, High Density Plasma (HDP) or Spin On Dielectric (SDP)] or a laminated structure of HDP and SDP.

Then, ions are implanted in the active region 202 exposed between the hard mask layers 210 so as to form an ion implantation region 206. In an embodiment, ion implantation is performed on a region where a gate pattern (fin gate pattern) is to be formed to define the ion implantation region 206. The implantation causes certain defects on the crystalline structure of the silicon (Si) material of the active region 202. Phosphorus (Ph) or arsenic (As) may be used in the ion implantation process if the N-type impurity region is desired. On the other hand, if the P-type impurity region is desired, boron (B), $BF_2$, or the like may be used.

Figure 5B:
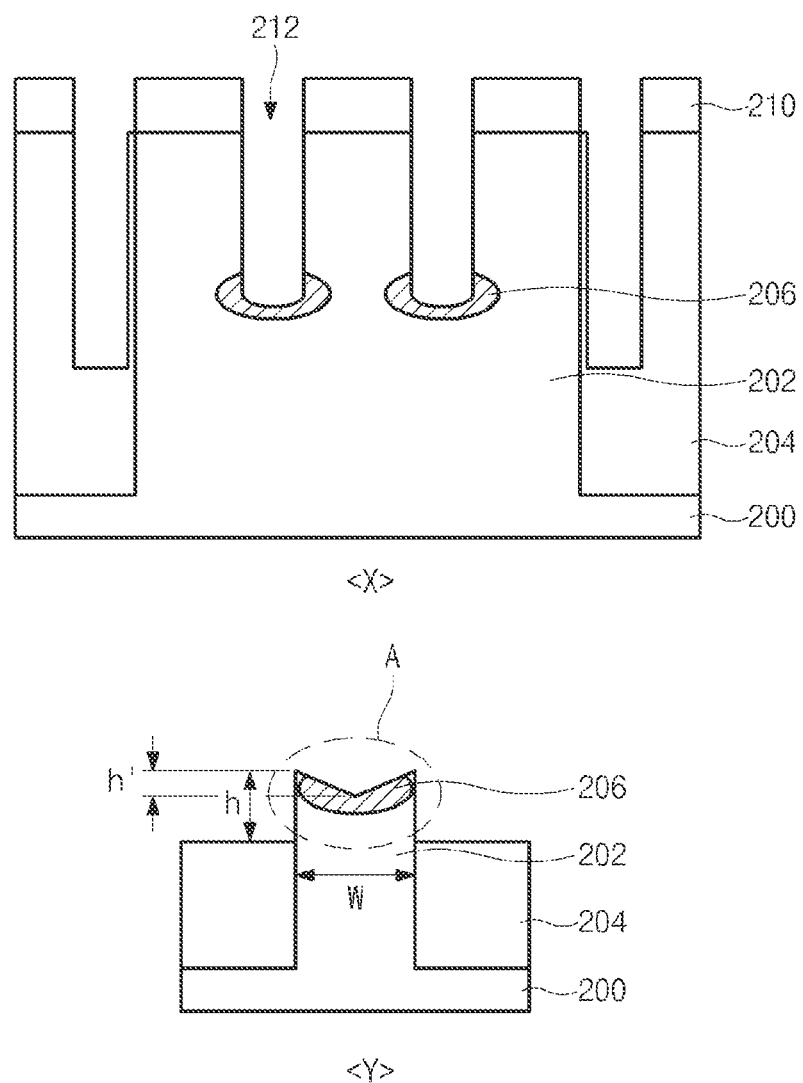

Referring to FIG. 5B, the device isolation film 204 and the active region 202 are etched to a predetermined depth using the patterned hard mask layer 210 as an etch mask, resulting in formation of a recess 212. Referring to the horizontal cross-sectional view <X>, the device isolation film 204 is more deeply etched than the active region 202 due to a difference in etch selection ratio between the device isolation film 204 and the active region 202, and some parts of the ion implantation region 206 are also etched. That is, the ion implantation region 206 is formed to contact the bottom of the recess 212.

Referring to the vertical cross-sectional view <Y>, the active region 202 protrudes more than the device isolation film 204 and is configured in the form of a saddle fin, but a profile of the top surface of the active region 202 is formed uneven. In other words, the portion of the active region 202 that has higher impurity concentration tends to etch faster since such a portion has a greater crystalline defect due to the greater ions being implanted thereto. The concentration gradient tends to increase towards the middle of the recess 212 since the ions are more likely to be implanted in the middle. Accordingly, the region 206 is provided with a concaved shape or uneven top surface. See "A" in FIG. 5B.

In an embodiment, an M-shaped saddle-fin structure is formed. FIG. 5B has been drawn to emphasis the unevenness of the top surface of the fin structure. However, a person skilled in the art would appreciate that the corners and the middle section may be less angular according to implementation.

In an embodiment, a semiconductor device is configured to have the depth (h') of the center section of the active region 202 to be at least 20% of the width (W) of the fin structure. The depth h' is the difference in height between the apex at the outer edge of the fin structure and the center section of the fin structure. Such a semiconductor device has a longer channel length and displays a superior or high operation speed. In this case, the saddle-fin gate structure may include not only a recess structure for increasing a channel area by recessing the semiconductor substrate 200, but also a saddle-fin structure in which the device isolation film 204 and the active region 202 are partially etched to form a polyhedral channel structure (e.g., 3D structure). The saddle-fin structure having uneven surfaces enables a semiconductor device that operates at high speed and at low power.

Figure 5C:
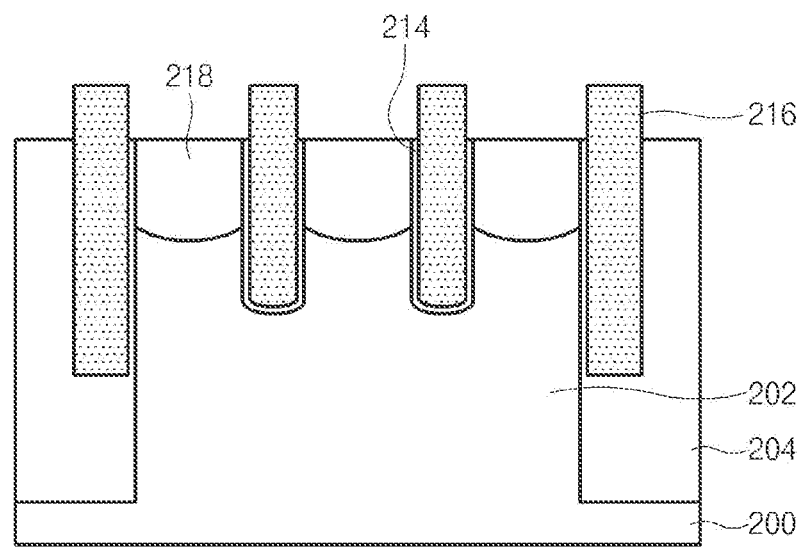
Figure 5C:
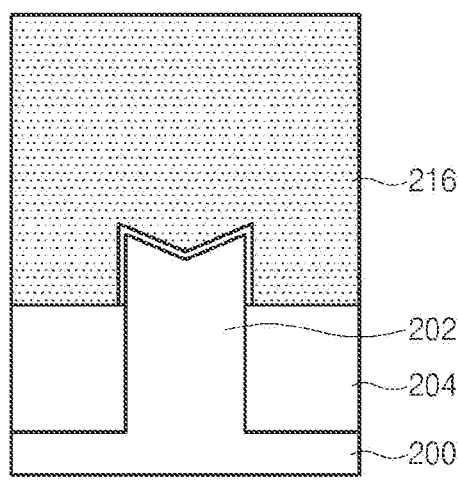

Referring to FIG. 5C, a gate oxide film 214 is formed over the active region 202 exposed by the recess 212. Thereafter, a conductive material is deposited over the recess 212 so that the gate pattern 216 is formed. In this case, a conductive material may be formed of a gate polysilicon layer. After forming the gate pattern 216, the hard mask layer 210 is removed, and ions are implanted in the exposed active region 202, so that a source/drain region 218 is formed.

Figure 5D:
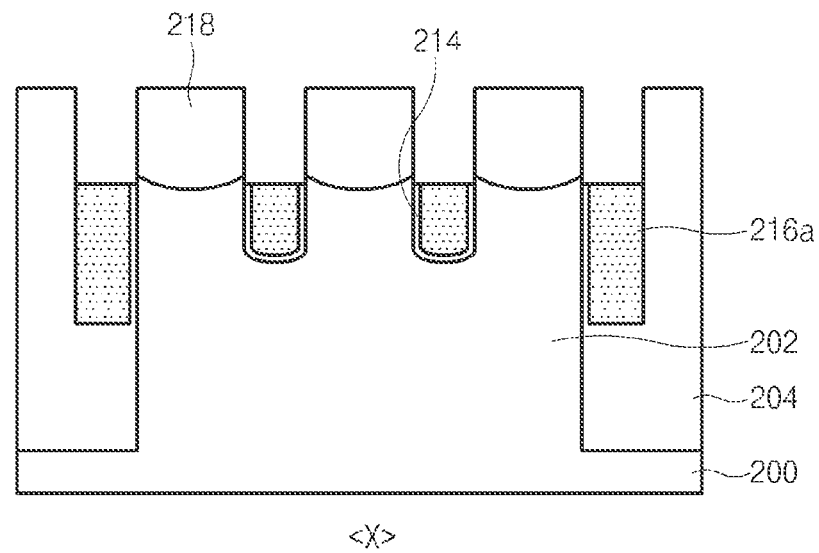
Figure 5D:
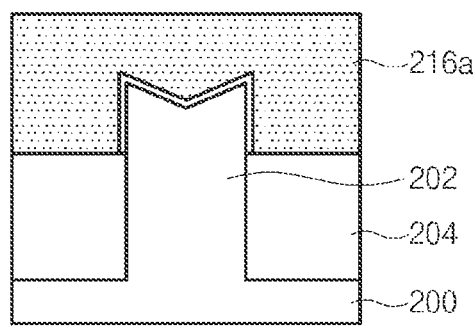

Referring to FIG. 5D, the gate pattern 216 is etched back to form a buried gate 216a, a hard mask layer 210 is removed, and ion implantation is performed on the exposed active region 202, such that a source/drain region 218 is formed.

Figure 6:
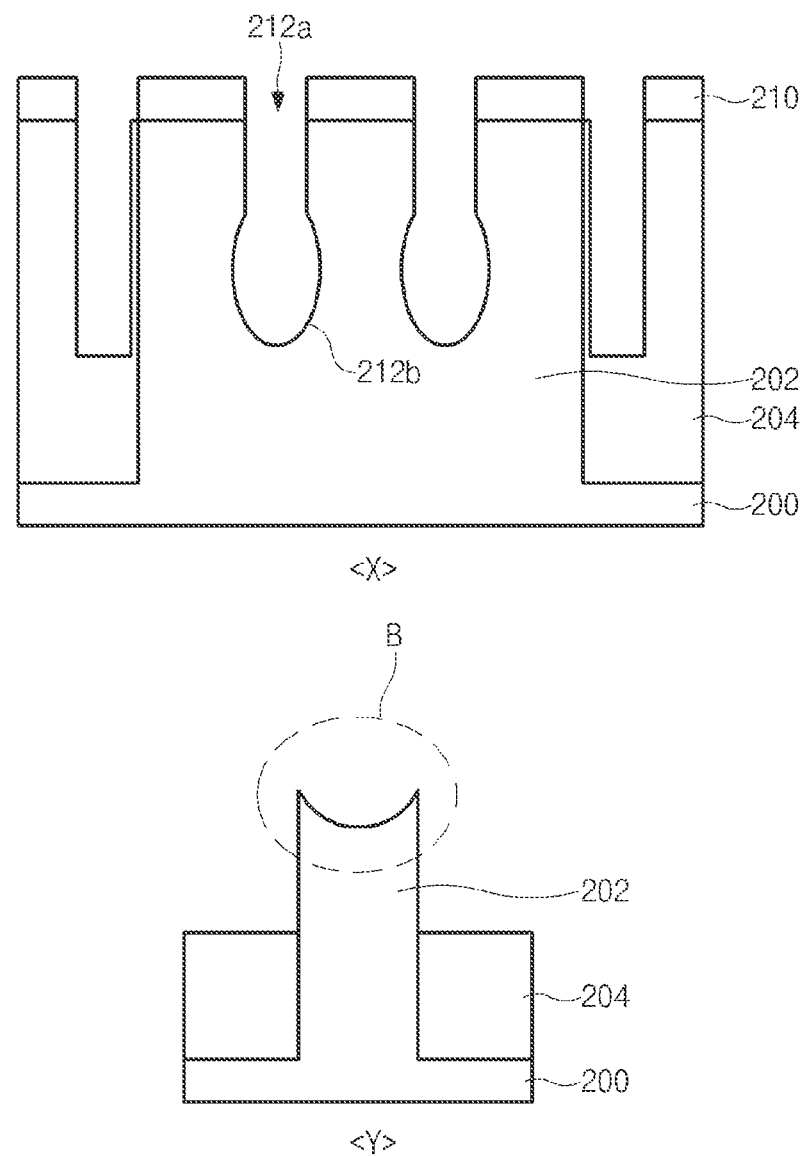
FIG. 6 is a cross-sectional view illustrating a method for fabricating a semiconductor device according to another embodiment of the present invention.

FIG. 6 is a cross-sectional view illustrating a method for fabricating a semiconductor device according to another embodiment of the present invention.

Figure 7:
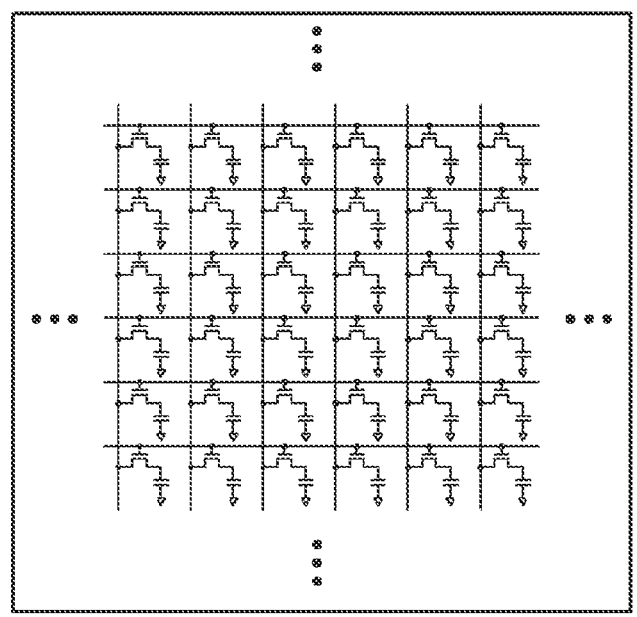
FIG. 7 illustrates a cell array according to the present invention.

Referring to the horizontal cross-sectional view <X> of FIG. 7, after the hard mask layer 210 is formed over the device isolation film 204 and the active region of the semiconductor substrate 200, the hard mask layer 210 is patterned using a mask that defines a specific position at which the gate pattern is to be formed.

The device isolation film 204 and the active region 202 are etched using a first etch step to a predetermined depth using the patterned hard mask layer 210 as an etch mask, so that a first recess 212a is formed. A lower part of the first recess 212a is etched using a second etch step so that a second recess 212b is formed to be rounded. In an embodiment, the first etch step is performed using anisotropic etching, and the second etch step is performed using isotropic etching.

Referring to the vertical cross-sectional view <Y> of FIG. 6, the active region 202 protrudes more than the device isolation film 204 and is configured in the form of a fin structure. The profile of the top surface of the fin structure of the active region 202 is configured to be uneven. In an embodiment, the fin structure has a rounded, concave top surface. See "B" of FIG. 6. The middle section of the fin structure of the present embodiment is more rounded than that formed by using an implantation step. See FIG. 5B. A gate oxide film (not shown) is formed over the active region 202. A conductive material (not shown) is deposited over the recess 212a to form a gate pattern (not shown), and other steps are performed as explained above to make the semiconductor device.

In another embodiment relates to a semiconductor device having a fin-shaped active region that has a non-uniform upper surface. The device includes a substrate an active region and a device isolation film having an upper surface. A recess is provided on the active region and has a bottom surface that is at a higher level than the upper surface of the device isolation film, the bottom surface of the recess being non-uniform. A gate structure is formed over the non-uniform bottom surface of the recess. The bottom surface of the recess defines a non-uniform upper surface of a fin-shaped active region. The active region extends along a first direction and the gate structure extends along a second direction different than the first direction. The non-uniform upper surface of the fin-shaped active region has a concave shape.

FIG. 7 illustrates a cell array according to the present invention.

Referring to FIG. 7, a cell array includes a plurality of memory cells, and each memory cell includes one transistor and one capacitor. Such memory cells are located at intersection points of bit lines BL1~BLn and word lines WL1~WLm. The memory cells may store or output data in response to a voltage applied to any bit line (BL1, . . . , BLn) and any word line (WL1, . . . , WLm) selected by a column decoder and a row decoder.

Figure 8:
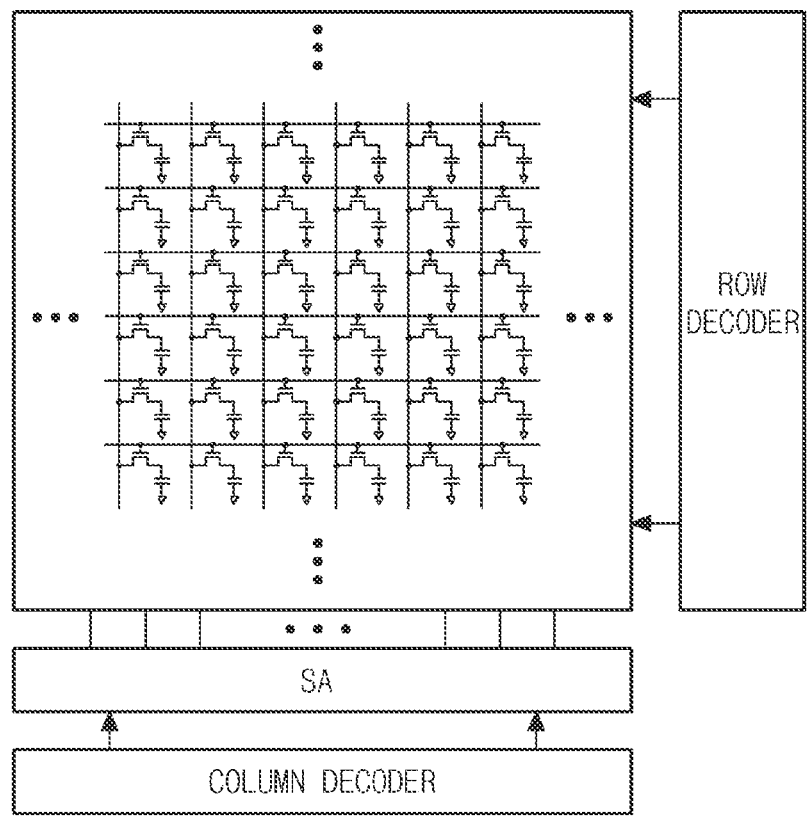
FIG. 8 is a block diagram illustrating a semiconductor device according to the present invention.

As can be seen from FIG. 8, a first direction (i.e., a bit-line direction) of the bit lines (BL1, . . . , BLn) of the cell array are formed in the longitudinal direction, and a second direction (i.e., a word-line direction) of the word lines (WL1, . . . , WLm) is formed in the longitudinal direction, such that the bit lines (BL1, . . . , BLn) are crossed with the word lines (WL1, . . . , WLm). A first terminal (for example, a drain terminal) of a transistor is coupled to the bit lines (BL1, . . . , BLn), a second terminal (for example, a source terminal) thereof is coupled to a capacitor, a third terminal thereof (for example, a gate terminal) is coupled to the word lines (WL1, . . . , WLm). A plurality of memory cells including the bit lines (BL1, . . . , BLn) and the word lines (WL1, . . . , WLm) may be located in a semiconductor cell array.

FIG. 8 is a block diagram illustrating a semiconductor device according to the present invention.

Referring to FIG. 8, the semiconductor device may include a cell array, a row decoder, a column decoder, and a sense amplifier (SA). The row decoder selects a word line corresponding to a memory cell in which a read or write operation is to be performed from among a plurality of word lines of the semiconductor cell array, and outputs a word-line selection signal (RS) to the semiconductor cell array. In addition, the column decoder selects a bit line corresponding to a memory cell in which a read or write operation is to be performed from among a plurality of bit lines of the semiconductor cell array, and outputs a bit-line selection signal (CS) to the semiconductor cell array. In addition, the sense-amplifier (SA) may sense data (BDS) stored in a memory cell selected by the row decoder and column decoder.

Figure 9:
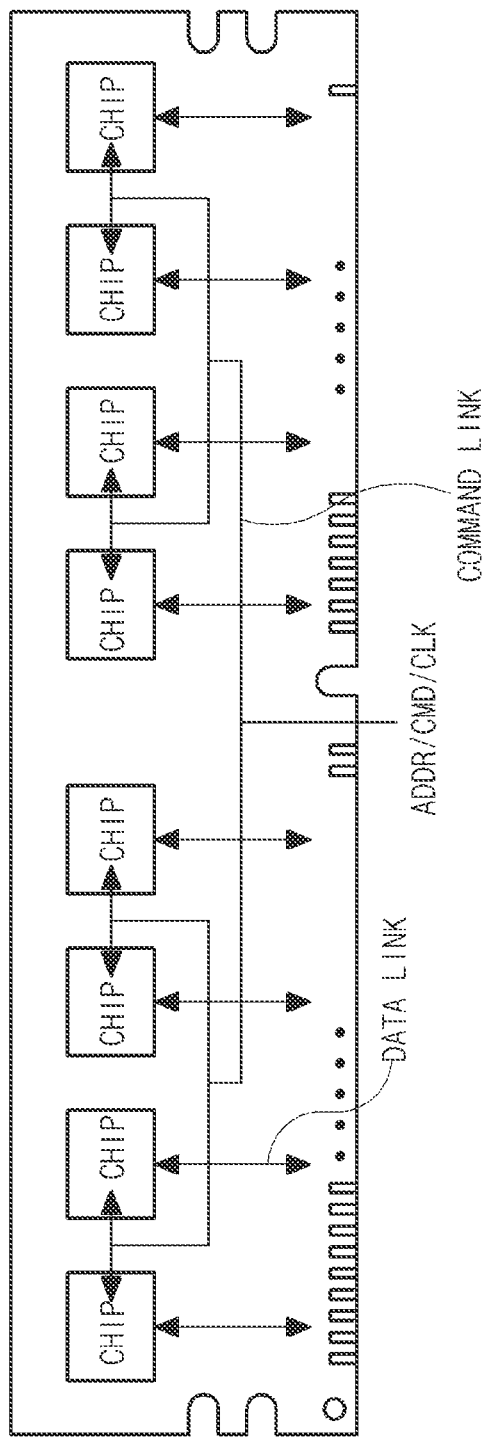
FIG. 9 is a block diagram illustrating a semiconductor module according to the present invention.

The semiconductor device of FIG. 9 may be coupled to a microprocessor or a memory controller. The semiconductor device may receive control signals such as WE*, RAS* and CAS* from the microprocessor, receive data through an input/output (I/O) circuit, and store the received data. The semiconductor device may be applied to a Dynamic Random Access Memory (DRAM), a P-Random Access Memory (P-RAM), an M-Random Access Memory (M-RAM), a NAND flash memory, and a CMOS Image Sensor (CIS), and the like. Specifically, the semiconductor device may be applicable to a desktop, a laptop, or a server, and may also be applicable to graphics memory and mobile memory (e.g., memory card, memory stick). The NAND flash memory may be applicable not only to a variety of portable storage media (for example, a memory stick, a multimedia card (MMC), a secure digital (SD) card a compact flash (CF) card, an eXtreme Digital (XD) picture card, a universal serial bus (USB) flash drive, etc.), but also to a variety of digital applications (for example, MP3, PMP, digital camera, camcorder, memory card, USB, game machine, navigation, laptop, desktop computer, mobile phone, and the like). The CMOS Image Sensor (CIS) is a charge coupled device (CCD) serving as an electronic film in digital devices, and is applicable to a camera phone, a Web camera, a small-sized medical imaging devices, etc.

FIG. 9 is a block diagram illustrating a semiconductor module according to the present invention.

Referring to FIG. 9, a semiconductor module includes a plurality of semiconductor devices mounted to a module substrate, a command link for enabling each semiconductor device to receive a control signal (address signal (ADDR)), a command signal (CMD), and a clock signal (CLK) from an external controller (not shown), and a data link coupled to a semiconductor device so as to transmit data.

In this case, the semiconductor device may correspond to the semiconductor devices disclosed in FIG. 8. In addition, the command link and the data link may be formed to be identical or similar to those of conventional semiconductor modules.

Although eight semiconductor chips are mounted to the front surface of the module substrate as shown in FIG. 9, it should be noted that the semiconductor chips can also be mounted to the back surface of the module substrate. That is, the semiconductor chips can be mounted to one side or both sides of the module substrate, and the number of mounted semiconductor chips is not limited only to the example of FIG. 10. In addition, a material or structure of the module substrate is not limited only to those of FIG. 9, and the module substrate may also be formed of other materials or structures.

Figure 10:
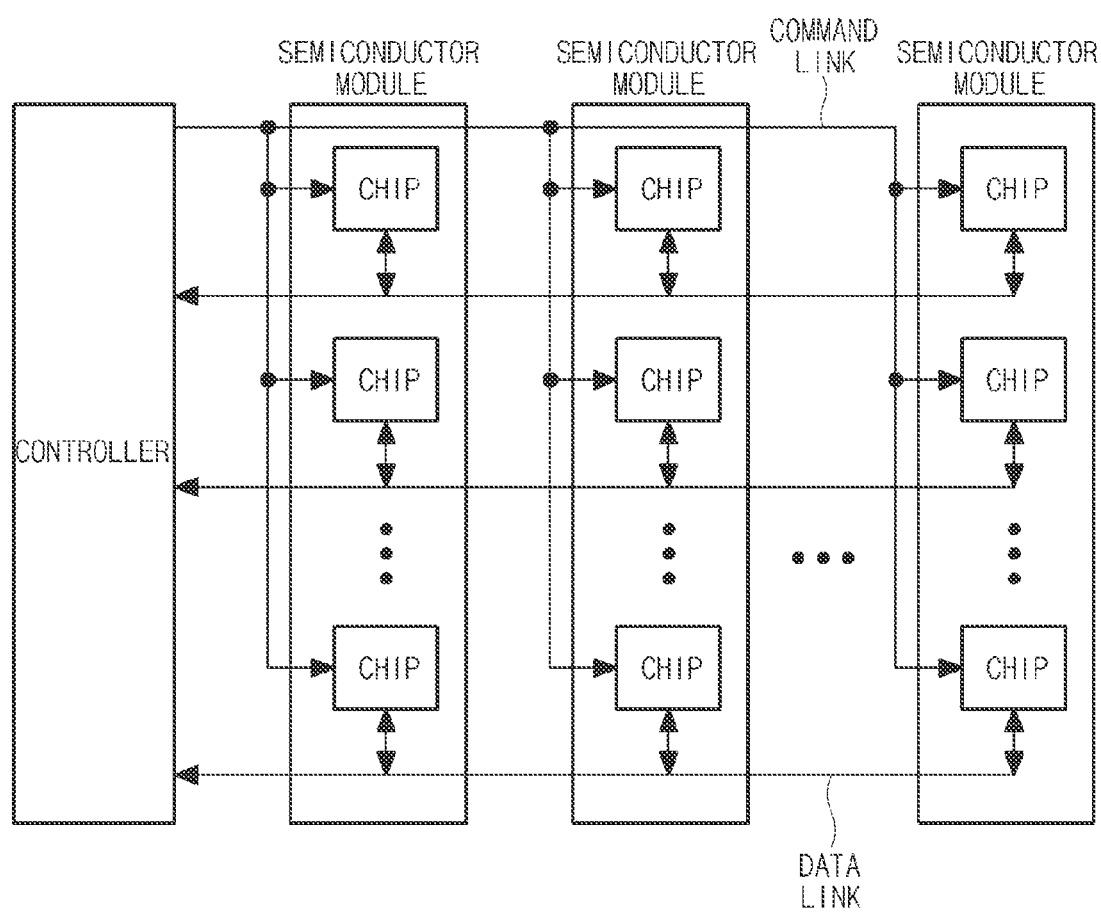
FIG. 10 is a block diagram illustrating a semiconductor system according to the present invention.

FIG. 10 is a block diagram illustrating a semiconductor system according to the present invention.

Referring to FIG. 10, a semiconductor system includes at least one semiconductor module including a plurality of semiconductor chips, and a controller for providing a bidirectional interface between each semiconductor module and an external system (not shown) so as to control the operations of the semiconductor module. The controller may be identical or similar in function to a controller for controlling a plurality of semiconductor modules for use in a conventional data processing system, and as such a detailed description thereof will herein be omitted for convenience of description. In this case, the semiconductor module may be, for example, a semiconductor module shown in FIG. 9.

Figure 11:
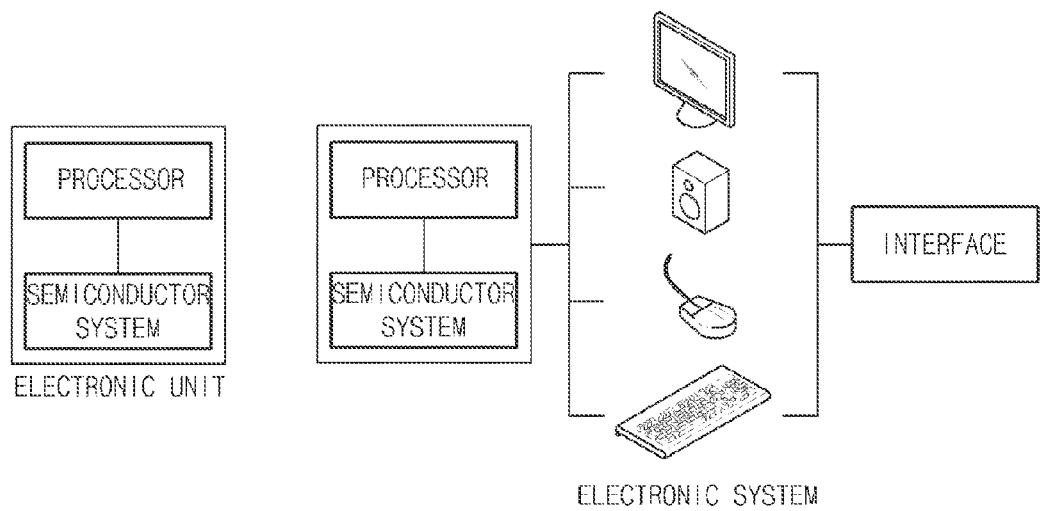
FIG. 11 is a block diagram illustrating an electronic unit and an electronic system according to embodiments of the present invention.

FIG. 11 is a block diagram illustrating an electronic unit and an electronic system according to embodiments of the present invention.

Referring to FIG. 11, the electronic unit according to the present invention includes an electronic unit and a processor electrically coupled to the electronic unit. In this case, the semiconductor system of FIG. 11 is identical to that of FIG. 10. In this case, the processor may include a Central Processing Unit (CPU), a Micro Processor Unit (MPU), a Micro Controller Unit (MCU), a Graphics Processing Unit (GPU), and a Digital Signal Processor (DSP).

In this case, the CPU or MPU functions as a combination of an Arithmetic Logic Unit (ALU) (for arithmetic and logical operations) and a Control Unit (CU) (for controlling each unit by reading and interpreting a command). Preferably, if the processor is a CPU or MPU, the electronic unit may include a computer device or a mobile device. In addition, the GPU serving as a CPU for graphics is used to calculate numbers having decimal points, and corresponds to a process for drawing graphic data as a real-time image. Preferably, if the processor is a GPU, the electronic unit may include a graphic device. In addition, Digital Signal Processing (DSP) is a process that converts an analog signal (e.g., voice signal) into a digital signal at high speed, uses the calculated result, re-converts the digital signal into the analog signal, and uses the re-converted result. The Digital Signal Processor (DSP) mainly calculates a digital value. If the processor is a DSP, the electronic unit may preferably include a sound and imaging device.

The processor may also include an Accelerate Processor Unit (ACU), and is configured in the form of a CPU integrated into the GPU, such that it serves as a graphic card.

Referring to FIG. 11, the electronic system may include one or more interfaces electrically coupled to the electronic unit. In this case, the electronic unit is identical to that of FIG. 11. In this case, the interface may include a monitor, a keyboard, a printer, a pointing device (mouse), a USB, a switch, a card reader, a keypad, a dispenser, a phone, a display or speaker. However, it should be noted that the scope of the interface is not limited thereto and is also applicable to other examples.

As is apparent from the above description, the fin for use in the semiconductor device having a fin-shaped channel region is configured with a dual peak, such that an off-leakage characteristic of the fin-shaped gate is improved by increasing the fin length. The neighbor gate effect is reduced such that dynamic refresh characteristics can be improved. In addition, a current is increased because of a dual-peak fin structure or V-shaped fin structure.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device, comprising:
   a substrate, an active region having an ion implantation region, and a device isolation film having an upper surface;
   a recess being provided in the active region and having a bottom surface that is at a higher level than the upper surface of the device isolation film, the bottom surface of the recess being non-uniform; and
   a gate structure formed over the non-uniform bottom surface of the recess,
   wherein the ion implantation region is formed within a top surface of the active region to contact the bottom of the recess.

2. The device of claim 1, wherein the bottom surface of the recess defines a non-uniform top surface of a fin-shaped active region.

3. The device of claim 2, wherein the active region extends along a first direction and the gate structure extends along a second direction different than the first direction, and wherein the non-uniform upper surface of the fin-shaped active region has a concave shape.

4. The device of claim 1, wherein the center of the top surface of the fin-shaped active region is lower in height than the outer edge of the top surface, and
   wherein the depth of the recess at the center of the top surface is at least 20% of the width (W) of the fin-shaped active region.

* * * * *